(12) United States Patent
Maeda et al.

(10) Patent No.: US 8,003,441 B2
(45) Date of Patent: Aug. 23, 2011

(54) MANUFACTURING METHOD OF SEMICONDUCTOR DEVICE

(75) Inventors: Jun Maeda, Munich (DE); Keiko Tanaka, Gunma (JP); Osamu Yamazaki, Saitama (JP)

(73) Assignee: LINTEC Corporation, Tokyo (JP)

( * ) Notice: Subject to any disclaimer, the term of this patent is extended or adjusted under 35 U.S.C. 154(b) by 70 days.

(21) Appl. No.: 12/670,127

(22) PCT Filed: Jul. 18, 2008

(86) PCT No.: PCT/JP2008/063020
§ 371 (c)(1),
(2), (4) Date: Jan. 22, 2010

(87) PCT Pub. No.: WO2009/014087
PCT Pub. Date: Jan. 29, 2009

(65) Prior Publication Data
US 2010/0190293 A1     Jul. 29, 2010

(30) Foreign Application Priority Data
Jul. 23, 2007   (JP) .................. 2007-190372

(51) Int. Cl.
*H01L 21/301* (2006.01)
*H01L 21/304* (2006.01)
*H01L 21/58* (2006.01)
*H01L 21/60* (2006.01)

(52) U.S. Cl. ............... 438/113; 438/464; 257/E21.519; 257/E21.599

(58) Field of Classification Search ............... 438/113, 438/460, 462, 464; 257/E21.499, E21.506, 257/E21.519, E21.599
See application file for complete search history.

(56) References Cited

U.S. PATENT DOCUMENTS

| | | | | | |
|---|---|---|---|---|---|
| 5,593,917 | A | * | 1/1997 | Nuyen | 438/28 |
| 5,667,884 | A | * | 9/1997 | Bolger | 428/323 |
| 5,840,417 | A | * | 11/1998 | Bolger | 428/323 |
| 5,861,661 | A | * | 1/1999 | Tang et al. | 257/668 |

(Continued)

FOREIGN PATENT DOCUMENTS

JP           05335411 A     12/1993
(Continued)

OTHER PUBLICATIONS

Patent Abstract of JP 09-213741 (Aug. 15, 1997).
(Continued)

*Primary Examiner* — Mary Wilczewski
(74) *Attorney, Agent, or Firm* — Cahn & Samuels, LLP

(57) ABSTRACT

A manufacturing method of a semiconductor device according to the present invention comprises:
  laminating a surface protective sheet to a circuit surface side of a wafer formed with grooves which divide each circuit wherein an adhesive film is adhered on the circuit surface of the wafer;
  reducing the thickness of the wafer and finally dividing the wafer into individual chips by grinding a back face of the wafer;
  picking up individual chips together with the adhesive film;
  die-bonding said individual chip to predetermined position of a chip mounting substrate via said adhesive film;
  fixing the chip to the chip mounting substrate by heating the die-bonded chip having the adhesive film; and
  applying a static pressure larger than an ambient pressure by 0.05 MPa or more to a stacked body including the adhesive film one or more times, at any point between adhering the wafer to the adhesive film and fixing the chip to the chip mounting substrate.

3 Claims, 4 Drawing Sheets

U.S. PATENT DOCUMENTS

| | | | | |
|---|---|---|---|---|
| 5,888,883 | A * | 3/1999 | Sasaki et al. | 438/460 |
| 6,294,439 | B1 * | 9/2001 | Sasaki et al. | 438/464 |
| 6,337,258 | B1 * | 1/2002 | Nakayoshi et al. | 438/464 |
| 6,461,938 | B2 * | 10/2002 | Nakabayashi | 438/458 |
| 6,465,330 | B1 * | 10/2002 | Takahashi et al. | 438/464 |
| 6,555,414 | B1 * | 4/2003 | Vanfleteren et al. | 438/108 |
| 6,613,610 | B2 * | 9/2003 | Iwafuchi et al. | 438/128 |
| 6,756,288 | B1 * | 6/2004 | Feil et al. | 438/464 |
| 6,777,313 | B2 * | 8/2004 | Takyu et al. | 438/464 |
| 6,838,316 | B2 * | 1/2005 | Iizuka et al. | 438/107 |
| 7,060,593 | B2 * | 6/2006 | Kurosawa et al. | 438/464 |
| 7,157,353 | B2 * | 1/2007 | Farnworth et al. | 438/462 |
| 7,273,768 | B2 * | 9/2007 | Hwan | 438/113 |
| 7,285,437 | B2 * | 10/2007 | Silverbrook | 438/51 |
| 2010/0291732 | A1 * | 11/2010 | Kurita | 438/107 |

FOREIGN PATENT DOCUMENTS

| | | |
|---|---|---|
| JP | 0913741 A | 8/1997 |
| JP | 10242208 A | 9/1998 |
| JP | 10270497 A | 10/1998 |
| JP | 2002118147 A | 4/2002 |
| JP | 2004311709 A | 11/2004 |
| JP | 2006261529 A | 9/2006 |

OTHER PUBLICATIONS

Patent Abstract of JP 10-242208 (Sep. 11, 1998).
Patent Abstract of JP 10-270497 (Oct. 9, 1998).
Patent Abstract of JP 05-335411 (Dec. 17, 1993).
Patent Abstract of JP 2006261529 (Sep. 28, 2006).
Patent Abstract of JP 2002118147 (Apr. 19, 2002).
Patent Abstract of JP 2004311709 (Nov. 4, 2004).

* cited by examiner

MANUFACTURING METHOD OF SEMICONDUCTOR DEVICE

This patent application is a U.S. national stage application of PCT international application PCT/JP2008/063020 filed on Jul. 18, 2008 which claims priority of Japanese patent document 2007-190372 filed on Jul. 23, 2007 in Japan.

TECHNICAL FIELD

The present invention relates to a manufacturing method of a semiconductor device. Further specifically, the present invention relates to a manufacturing method of a semiconductor device capable to continuously perform the mounting process which utilize a Dicing Before Grinding (DBG) process and a flip chip bonding process, and also the present invention relates to a manufacturing method of semiconductor device capable to contribute to simplify the manufacturing process and to improve the product quality.

BACKGROUND ART

For mounting multipin LSI packages to prepare MPUs, gate arrays or the like onto printed wiring boards, a flip chip mounting method has hitherto been adopted in which conductive projections (bumps) made of eutectic solder, high-temperature solder, gold or the like are formed on a connection pad part at a circuit surface side of a semiconductor chip (hereinafter referred as a chip or chips) and are confronted with and are brought into contact with corresponding terminal parts on a chip mounting substrate by so-called "facedown method" for melt/diffusion bonding. However, in this method, when exposed to a periodical temperature fluctuation, there is a possibility that the joint may brake due to the difference of a thermal expansion coefficient between the semiconductor chip and the chip mounting substrate. Thus, a method is proposed which comprises injecting a heat curable liquid resin (an underfill material) into a gap between the whole circuit face area of the semiconductor chip connected in a facedown state provided with the bump electrode and a chip mounting board opposing thereto; and then curing the heat curable liquid resin to bond the whole face of the bump joint portion to the chip mounting substrate. Thereby the thermal stress focused on the bump electrodes is dispersed to prevent the breaking. However, the gap between the semiconductor and the chip mounting substrate in the flip chip mounting, is as small as 40 to 200 μm. This causes to take considerable amount of time during the step of filling the underfill material without forming any voids; and viscosity control between the lots of the underfill material is complicated. Also, the amount of the underfill material to be filled is inconsistent which causes the quality of the product to vary.

In order to overcome these problems, for example, Patent document 1 (Japanese Patent Laid-Open No. H09-213741), Patent document 2 (Japanese Patent Laid-Open No. H10-242208), Patent document 3 (Japanese Patent Laid-Open No. H10-270497), and Patent document 4 (Japan Laid-Open No. 2002-118147) propose a technique in which a sheet-like heat curable resin or a thermoplastic resin are sandwiched between a semiconductor chip and chip mounting substrate, then performing thermocompression bonding. These sheet-like underfill materials are provided between the chip circuit face and chip mounting substrate, and are cured by predetermined means such as thermocompression or so to strongly adhere the chip circuit face and the chip mounting substrate.

Recently, so-called stud bumps with sharp tips are adopted as a form of the above bumps. When placing the sheet-like underfill material between the chip circuit face and the chip mounting substrate, the underfill material may break since the sheet-like underfill material is stretched due to the bump tips formed on the chip circuit face. When the underfill material is broken, it may cause the voids in the underfill material. Also, when adhering the sheet-like underfill material to the circuit face, air bubbles may be taken into the root part of the bumps depending on the form of the bumps thereby causing the voids. Further, when die-bonding via the sheet-like underfill material on the chip mounting substrate, the air bubbles may be taken in between the chip mounting substrate and the underfill material. Particularly, in recent years, patterned indents are formed sometimes by the wiring pattern on the chip mounting substrate surface which easily cause the voids. Also, although it depends on the type of the underfill materials, the voids may be formed due to the gas generated from the underfill materials during the curing step of the underfill materials.

If these voids remain within the underfill materials, it may become a starting point of the package crack. Hence, it is necessary to optimize the die-bonding condition to prevent the production of the voids. However, there are various package designs of the semiconductor device; further, the form, height and density of the bumps, and the surface form of the chip mounting substrate varies in a wide range, thus it is difficult to optimize the die-bonding condition.

In recent years, the IC cards have been widely used and further reduction of thickness thereof is demanded. Accordingly, it is now required that the thickness of the semiconductor chip, which has been about 350 μm, to be reduced to 20 to 100 μm or further less than this.

As a method to further reduce the thickness of the chip, patent document 5 (Japanese Patent Laid-Open No. H05-335411) discloses a process for producing the semiconductor chip wherein a groove of a predetermined depth is formed from a surface side of the wafer and, thereafter, the wafer is ground from a back face side. Such process is called "Dicing Before Grinding (DBG) process". According to such DBG process, the production of the bump chip having extremely thin thickness is possible.

However, even when mounting such chip having the bumps, the above described problem of the voids production cannot be solved. Thus, a technique which removes the void upon its production is in demand.

[Patent document 1] JP-A No. H09-213741
[Patent document 2] JP-A No. H10-242208
[Patent document 3] JP-A No. H10-270497
[Patent document 4] JP-A No. 2002-118147
[Patent document 5] JP-A No. H05-335411

DISCLOSURE OF THE INVENTION

Technical Problems to be Solved by the Invention

The present invention has been achieved in view of the above prior art, and its object is to provide a manufacturing method of a semiconductor device capable of continuously performing the mounting process which applies a so-called DBG process and a flip chip bonding method, and can contribute to simplify the manufacturing process and to improve the reliability without voids in the product.

Means for Solving the Technical Problems

The subject matter of the present invention which attain the above objects are as follows.

(1) a manufacturing method of a semiconductor device comprising:

laminating a surface protective sheet to a circuit surface side of a wafer formed with grooves which divide each circuit wherein an adhesive film is adhered on the circuit surface of the wafer;

reducing the thickness of the wafer and finally dividing the wafer into individual chips by grinding a back face of the wafer;

picking up individual chips together with the adhesive film;

die-bonding said individual chips to predetermined position of a chip mounting substrate via said adhesive film;

fixing the chip to the chip mounting substrate by heating the die-bonded chip having the adhesive film; and applying a static pressure larger than the ambient pressure by 0.05 MPa or more to a stacked body including the adhesive film one or more times, at any point between adhering the wafer to the adhesive film and fixing the chip to the chip mounting substrate.

(2) a manufacturing method of a semiconductor device as set forth in (1) wherein the static pressure is applied after the die-bonding.

(3) a manufacturing method of a semiconductor device as set forth in (1) wherein the chip is fixed to the chip mounting substrate while applying the static pressure.

Effects of the Invention

According to a manufacturing method of a semiconductor device of the present invention, even if voids are produced in an adhesive film used as an underfill material during mounting steps, the voids are removed by applying the static pressure, thereby the semiconductor device having a high reliability can be obtained. That is, the present invention provides the manufacturing method of a semiconductor device capable of continuously performing the mounting process which applies a so-called DBG process and a flip chip bonding method; and can contribute to simplify the manufacturing process and to improve the product quality.

BEST MODE FOR CARRYING OUT THE INVENTION

The present invention will be described in more details with reference to the accompanying drawings.

A manufacturing method of a semiconductor device according to the present invention comprises the following steps.

Figure 6:
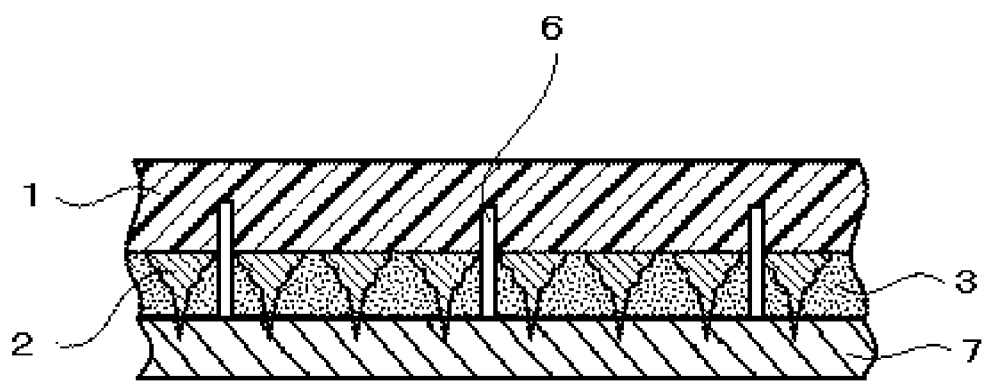
FIG. 6 shows one step of a manufacturing method of the present invention.
Figure 7:
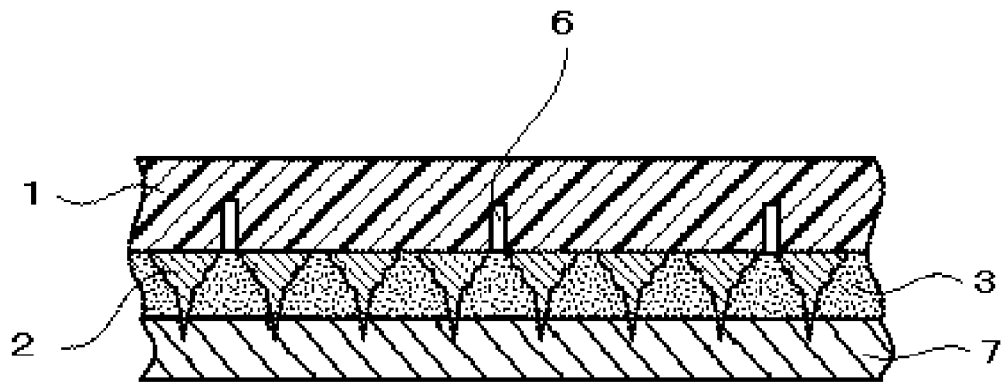
FIG. 7 shows one step of a manufacturing method of the present invention.
Figure 8:
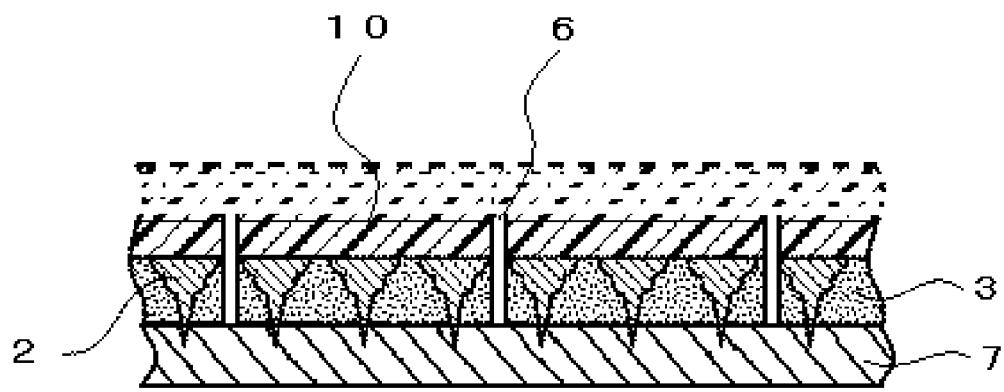
FIG. 8 shows one step of a manufacturing method of the present invention.
Figure 9:
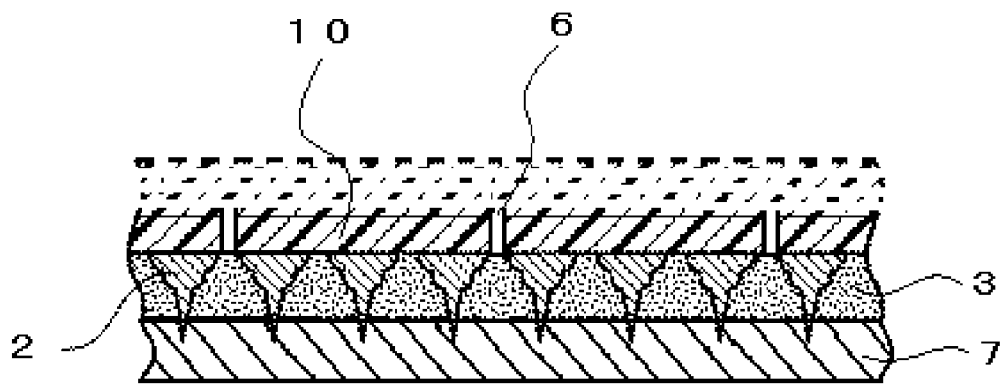
FIG. 9 shows one step of a manufacturing method of the present invention.
Figure 12:
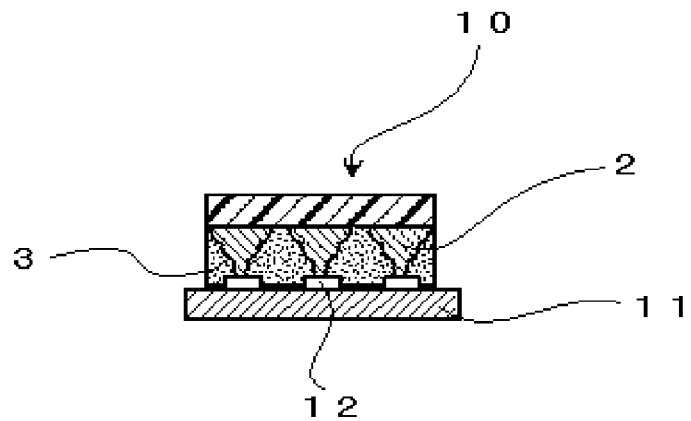
FIG. 12 shows one step of a manufacturing method of the present invention.

(S1) A step of laminating a surface protective sheet 7 to the circuit surface side of the wafer 1 formed with grooves 6 dividing each circuit wherein an adhesive film 3 for underfill is adhered on the circuit surface of a wafer 1 (refer to FIGS. 6 and 7);

(S2) the step of reducing the thickness of the wafer and finally dividing the wafer into individual chips by grinding a back face of the wafer (refer to FIGS. 8 and 9);

(S3) the step of picking up individual chips 10 with the adhesive film 3 (not illustrated);

(S4) the step of die-bonding said individual chips 10 to predetermined position of a chip mounting substrate 11 via said adhesive film 3 (refer to FIG. 12);

(S5) the step of fixing the chips 10 to the chip mounting substrate 11 by heating the die-bonded chips 10 having the adhesive film (not illustrated); and (IP) the step of applying a static pressure larger than an ambient pressure by 0.05 MPa or more to a stacked body including the adhesive film one or more times, at any point between said (S1) step and (S5) step.

Figure 2:
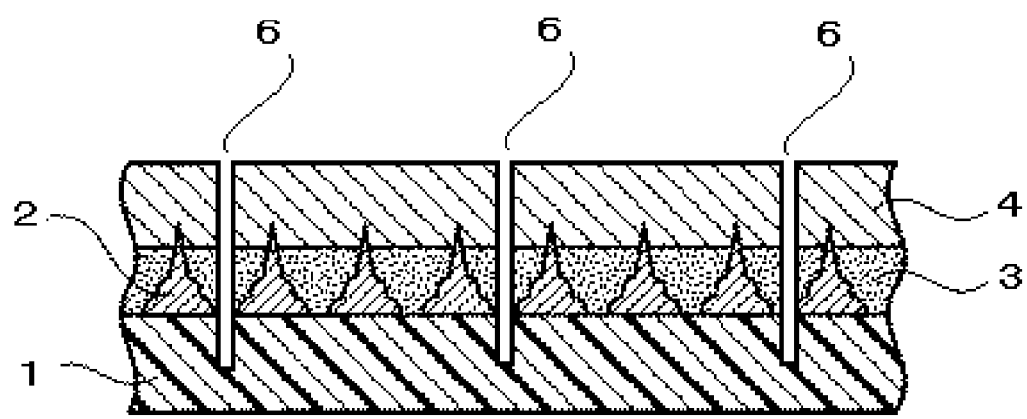
FIG. 2 shows one step of a manufacturing method of the present invention.
Figure 11:
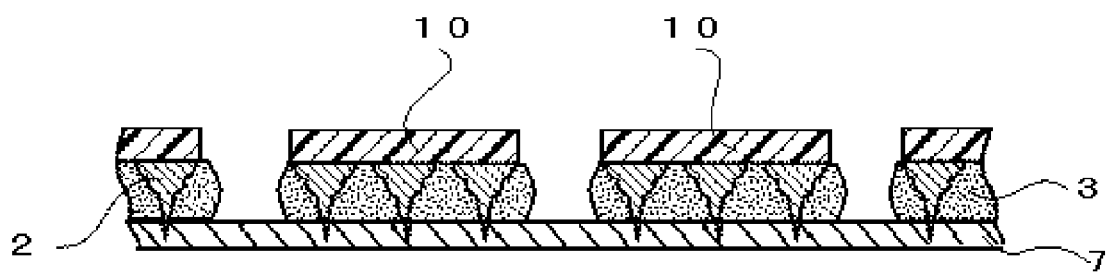
FIG. 11 shows one step of a manufacturing method of the present invention.

Also, in addition to above described each steps, the present invention preferably comprises the step of cutting the adhesive film 3 to roughly the same shape as the chip 10 which is being picked up, at any point between (S1) step and (S3) step (refer to FIGS. 2 and 11).

Following will explain the each steps.

(S1) Step

In (S1) step, the surface protective sheet 7 is laminated to the circuit surface side of the wafer 1 formed with grooves 6 which divides into each circuits wherein the adhesive film 3 is adhered to the circuit surface of the wafer 1 (refer to FIGS. 6 and 7).

Figure 1:
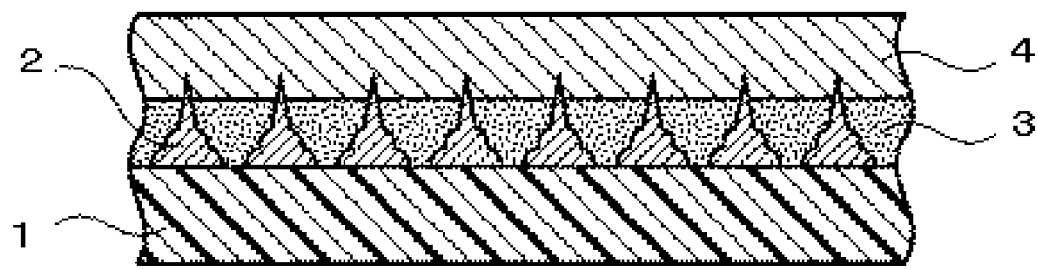
FIG. 1 shows one step of a manufacturing method of the present invention.

As for the wafer 1, conventionally used semiconductor wafer such as a silicon semiconductor wafer and gallium-arsenide semiconductor wafer may be used, however it is not limited to these; and various semiconductor wafers may be used. The circuit on the wafer surface may be formed by various methods including the etching method and the lift-off method which are widely used conventionally. During the formation step of circuit on the wafer, a predetermined circuit is formed. Also, conductive projections (bumps) 2, which are used to conduct with the chip mounting substrate 11, are preferably formed on the circuit face. The height and the diameter of the bumps 2 varies depending on the design of the semiconductor device, however, generally the height is 10 to 100 μm or so and the diameter is 20 to 100 μm or so. Such bumps 2 are formed, in many cases, by metal such as gold, copper, or solder or so. The shape of the bumps 2 is not particularly limited, yet, even when the stud bumps having sharp tips as shown in FIG. 1 which easily take in the air bubbles upon stacking the adhesive film 3 are used, the manufacturing method according to the present invention can remove the void. Therefore, the method according to the present invention can be applied particularly preferably to the wafer having the stud bumps.

In the manufacturing method of the semiconductor device according to the present invention, the adhesive film 3 is provided on the chip circuit face being picked up, and has a function as a sealing resin against the circuit face. Also, the adhesive film 3 is used to hold/fix the wafer upon back face grinding. Upon mounting the chip, it is used to fill the space between the chip mounting substrate and for adhering each other.

As the resin used for such adhesive film 3, the resin, which show some what of fluidity due to the heat and pressure force, follows the indents of the circuit face and expresses the adhesiveness by the heat during the step of laminating the circuit wafer to the adhesive film 3, are used. As such resin, for example, B-stage resin, hardenable pressure sensitive adhesive, or thermoplastic resin may be mentioned.

As B-stage resin used for the adhesive film 3, for example, a semi-cured epoxy resin may be mentioned.

The hardenable pressure sensitive adhesive used for the adhesive film 3 of the present invention show a tackiness and fluidity at normal temperature, and cured by heating to become non-flowable, along with firmly adhering with the adherend. As the hardenable pressure sensitive adhesive, for example, a mixture of a binder resin having pressure-sensitive adhesion at normal temperature and a thermo-setting resin may be mentioned.

Binder resins which have pressure-sensitivity adhesion at normal temperatures include, for example, acrylic resins, polyester resins, polyvinyl ether, urethane resins, and polyamides or so. As thermo-setting resins, for example, epoxy resins, acrylic resins, polyimide resins, phenol resins, urea resins, melamine resins, resolcinol resins or so may be used, and preferably epoxy resins are used. Also, it is preferable to incorporate energy ray (ultraviolet or so) curable resins such as urethane acrylate oligomers in the adhesives in order to regulate the releasing property from the surface protective sheet 7 described later. When the energy ray curable resins are incorporated, the surface protective sheet 7 adheres firmly to the hardenable pressure sensitive adhesive layer before applying the energy ray, and it becomes easy to peel off after applying the energy ray.

The hardenable pressure sensitive adhesives comprising such components described in above are; capable to adhere at normal temperatures, express appropriate fluidity by heating and pressure force, and have energy ray curability and heat curability. Thus, it follows the indents of the circuit face and allow to form resin layers without the void, contribute to fix the wafer by adhering to the surface protective sheet 7 during back face grinding; and can be used as the adhesive which adheres the chip and the chip mounting substrate upon mounting. Thereby, at the end it provides a highly impact resistant hardened product after heat curing. Further, it has good balance between the shear strength and the peel strength and can maintain satisfactory adhesive properties even under the high temperature and humidity conditions.

The thermoplastic resins used in the adhesive films 3 are resins which exhibits the adhesiveness by plasticizing due to the heat. As for such thermoplastic resins, for example, resins having a chemical and physical heat resistance such as polyimide are preferable, as it improves the reliability of the semiconductor device.

The thickness ($T_A$) of the adhesive film 3 comprising above described components is generally 3 to 100 µm, preferably 3 to 95 µm, more preferably 5 to 85 µm or so. Note that, in case the bumps are formed on the wafer surface, the adhesive film 3 covers the circuits face without voids, and the bumps pierce there through. Thus the ratio ($H_B/T_A$) between the average height ($H_B$) of the bumps and the thickness of the adhesive film 3 ($T_A$) is within the range of 1.0/0.3 to 1.0/0.95, preferably 1.0/0.5 to 1.0/0.9, more preferably 1.0/0.6 to 1.0/0.85, and most preferably 1.0/0.7 to 1.0/0.8. The average height of the bumps ($H_B$) is the height from the chip surface (circuit face excluding the bumps) to the top of the bumps. When plurality of the bump is present, the average height is calculated by an arithmetic mean thereof.

When the height of the bumps is excessively higher relative to the thickness of the adhesive film 3, the chip surface (circuit face excluding bumps) and the chip mounting substrate 11 forms a space therebetween, and causes voids formation. On the other hand, when the adhesive film 3 is excessively thicker, the bumps cannot pierce through the adhesive film 3, thereby causes loose conductivity.

Note that, as long as the operativity is not damaged, the adhesive film 3 may be single layer. However, as can be seen in FIG. 1, normally it is stacked on the supporting film 4.

As for the supporting sheet 4, for example, polyethylene films, polypropylene films, polybutene films, polybutadiene films, polymethylpentene films, polyvinyl chloride films, vinyl chloride copolymer films, polyurethane films, ethylene-vinyl acetate films, ionomer resin films, ethylene (meth) acrylic acid copolymer films, ethylene (meth) acrylic ester copolymer films, and fluororesin films or so may be used. Crosslinked films of these materials may also be used. Further, laminated films of these materials are also possible. These films may be any of the transparent films, colored films or opaque films. Note that, when the supporting film 4 is too hard, the top of the bumps may be crushed. Therefore, films having an appropriate elasticity are preferably used. The adhesive film 3 on the supporting film 4 is transferred on to the circuit face of a chip (a wafer). The supporting film 4 and the adhesive film 3 are stacked releasably from each other, so that the adhesive film 3 on the supporting film 4 can be transferred on to the circuit face of a chip (a wafer). Accordingly the surface tension of the supporting film 4 on its surface in contact with the adhesive film 3 is preferably not more than 40 mN/m, and more preferably not more than 37 mN/m, and particularly not more than 35 mN/m. The film having such a low surface tension can be obtained by properly selecting the material. Alternatively, the film can also be obtained by applying a release agent to a film, that is, by coating a release agent such as a silicone resin or an alkyd resin onto the surface film.

The film thickness of the supporting film 4 is generally, 10 to 500 µm, preferably 15 to 300 µm, and particularly preferably 20 to 250 µm or so.

This supporting film 4 may be released after laminating the adhesive film 3 to the wafer circuit face; or it may be released from the adhesive film 3 at the pick up step (S3) of the chip. Following will explain the embodiment in which the supporting film 4 is peeled off right after laminating the adhesive film 3 to the wafer circuit face, however the supporting film 4 may be released at (S3) step.

Figure 5:
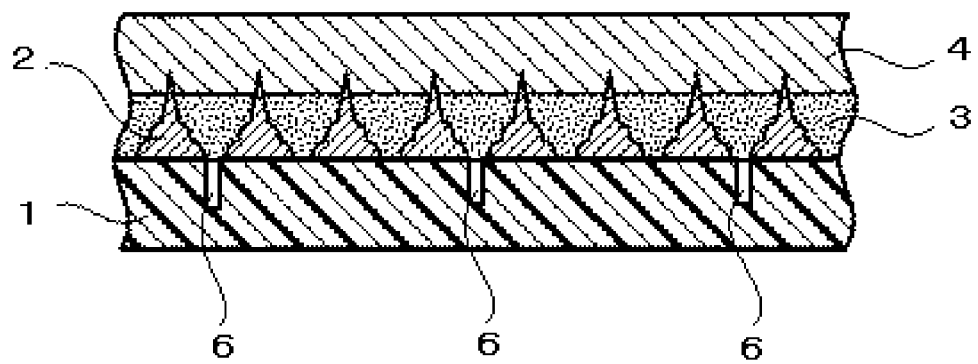
FIG. 5 shows one step of a manufacturing method of the present invention.

In (S1) step, a status wherein the adhesive film 3 is adhered to the circuit surface of wafer 1 formed with the grooves 6 which sections each circuit is established (refer to FIGS. 2 and 5). During said status, the surface protective sheet 7 is laminated to the circuit surface side of the wafer 1 (that is on the adhesive film 3 side).

The formation of the grooves 6 is generally performed by half cut dicing which uses dicing blades or so. Also, it may be a half cut using a laser beam. The grooves 6 are formed so that it sections each circuit formed on the wafer 1. The depth of the grooves in the wafer 1 is not particularly limited as long as it is larger than the thickness of the final chip form, and does not damage the handling property of the wafer 1.

Also, the adhesive film may be cut (FC step) simultaneously with the formation of the grooves 6.

That is, as shown in FIG. 1, the adhesive film 3 temporarily provided on the supporting film 4 is stacked on the circuit face side of the wafer 1, then the adhesive film 3 is cut from the adhesive film 3 side to form the grooves 6 such that the wafer 1 is partially cut. In case the supporting film 4 is staked on the adhesive film 3, as shown in FIG. 2, the grooves 6 are formed from the supporting film 4 side, hence the supporting film 4 is completely cut.

Figure 3:
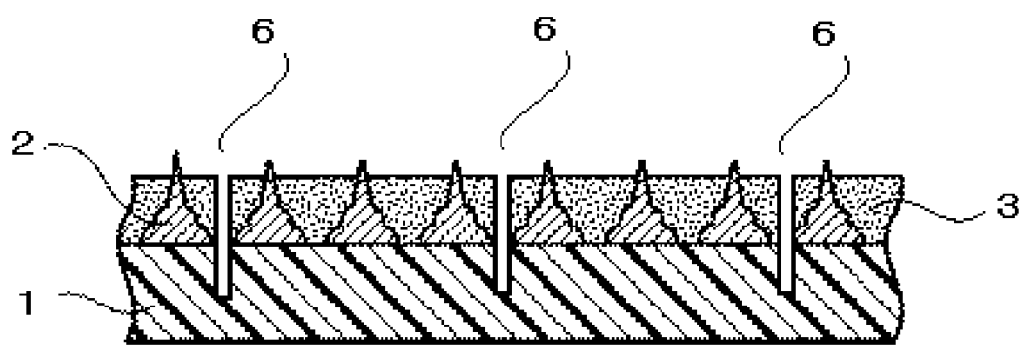
FIG. 3 shows one step of a manufacturing method of the present invention.

Then, by peeling the supporting film 4, the adhesive film 3 is adhered to the circuit surface of the wafer 1 formed with the grooves 6 (refer to FIG. 3).

Alternatively, the grooves 6 may be formed independently from the adhesive film cutting (FC step).

Figure 4:
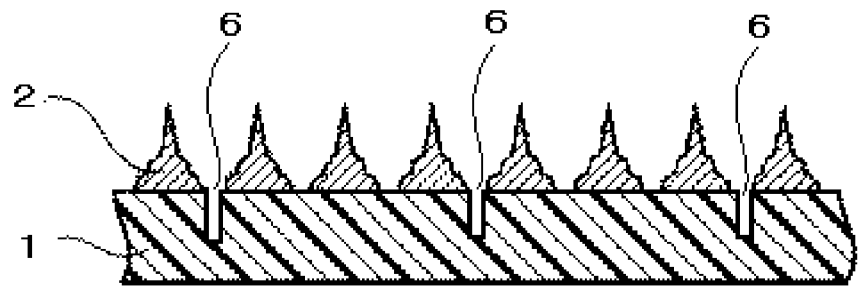
FIG. 4 shows one step of a manufacturing method of the present invention.

That is, as shown in FIG. 4, first the grooves 6 are formed only on the circuit surface of the wafer 1, and the adhesive film 3 temporarily provided on the supporting film 4 is staked on the circuit face side of the wafer 1. Then, the adhesive film 3 is adhered to the circuit surface of the wafer 1 formed with the grooves 6, by peeling off the supporting film 4.

In this case, the cutting of the adhesive film 3 (FC step) is performed at any point before (S3) which are described in the followings. Specifically, the adhesive film 3 is adhered to the circuit face of the wafer 1 formed with the grooves 6 (refer to FIG. 5), then while in this stage, the adhesive film 3 may be completely cut along the grooves 6 using the dicing blades or the laser beam. In case the supporting film 4 is stacked on the adhesive film 3, the supporting film 4 will also be cut completely.

Figure 10:
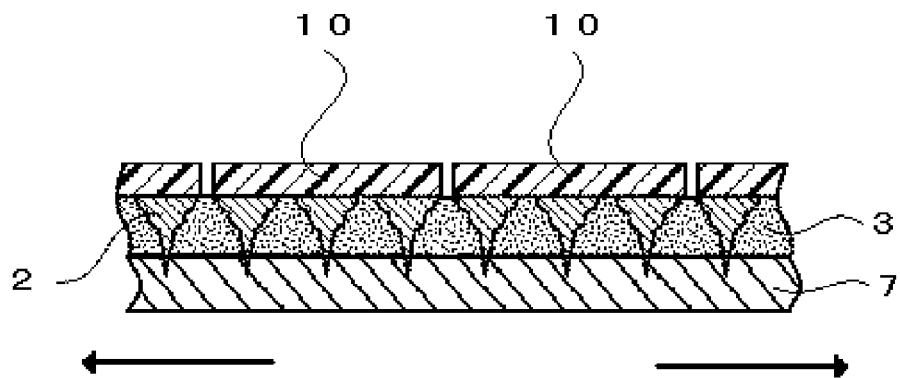
FIG. 10 shows one step of a manufacturing method of the present invention.

Also, in case the step of making the space between each chip 10 by expanding the surface protective sheet is included before the (S3) step, which is described in the followings, the adhesive film 3 may be cut by the stretching stress during the expansion as shown in FIGS. 10 and 11. In such case, the adhesive film 3 adhered to the chip 10 does not stretch since the deformation is restrained by the chip; however, since the deformation of the adhesive film positioned between the chips are not restrained, it is cut roughly the same shape as the chip by stretching.

As described in above, after establishing the status in which the adhesive film 3 is adhered to the circuit surface of the wafer 1 formed with the grooves 6, the surface protective sheet 7 is laminated on the circuit surface side of the wafer 1 (that is on the adhesive film 3 surface) (refer to FIGS. 6 and 7).

The surface protective sheet 7 is laminated in order to hold the wafer 1 and to protect the circuit face during the back face grinding step (S2).

As the surface protective sheet 7, various pressure-sensitive adhesive sheets used for this type of purpose are used without any particular limitation.

Note that, when said supporting film 4 is released and the surface protective sheet 7 is laminated on the adhesive film 3 during the pick up step (S3), which is described in the following, the releasing is performed at the boundary between the adhesive film 3 and the surface protective sheet 7. Thus, the adhesive film 3 and the surface protective sheet 7 are staked removably.

When the adhesive film 3 has pressure-sensitive property, the surface protective sheet 7 does not necessary need to have a adhesiveness, and it may be resin films. As for such resin films; polyethylene films, polypropylene films, polybutene films, polybutadiene films, polymethylpentene films, polyvinyl chloride films, vinyl chloride copolymer films, polyethyleneterephthalate films, polyethylenenaphthalate films, polybutylenetelephthalate films, polyurethane films, ethylene-vinyl acetate films, ionomer resin films, ethylene (meth) acrylic acid copolymer films, ethylene (meth) acrylic ester copolymer films, polystyrene films, polycarbonate films, and polyimide films or so may be used. Also, crosslinked films of these may also be used. Further, it may be laminated films of these.

In case the adhesive film 3 does not have the pressure-sensitive property, the surface protective sheet 7 may be resin films having tackiness by itself. Also, the surface protective sheet 7 may be a weak adhesive sheet comprising a removable pressure-sensitive adhesive layer to the resin films surface.

Also, in case the adhesive film 3 does not have the energy ray curability, then the energy ray curable pressure-sensitive adhesive sheet may be used as the surface protective sheet 7. The energy ray curable pressure-sensitive adhesive sheet is also called as UV tape or UV sheet. The pressure-sensitive adhesive layer thereof has a property that it cures by the energy ray such as ultraviolet beam, and has a property that it looses the adhesion. Therefore, after laminating the energy ray curable adhesive sheet to the face of adhesive film 3, and after the back face grinding step (S2), the adhesion is lost by applying the energy ray to the adhesive layer; thus it becomes easy to peel at the boundary between the adhesive film 3 and the surface protective sheet 7.

The form of above described surface protective sheet 7 has roughly the same shape as the wafer 1. In this case the surface protective sheet 7 can be cut into the shape of the wafer 1 in advance, or it may be cut along the outer peripheral of the wafer 1 after laminated on the wafer 1. The thickness of the surface protective sheet 7 is generally 20 to 1000 μm, and preferably 50 to 250 μm. In case the surface protective sheet 7 comprises the adhesive layer, the thickness of the adhesive layer among the above described thickness is 5 to 500 μm, and preferably 10 to 100 μm.

Note that, in case the cut of the adhesive film 3 (FC step) is performed simultaneously with the expansion of the surface protective sheet 7; the surface protective sheet 7 having an expansion property is used.

(S2) Step

In step (S2), the thickness of the wafer 1 is made thin by back face grinding of above described wafer 1, and finally dividing into each individual chips 10 (refer to FIGS. 8 and 9).

The back face grinding of the wafer 1 is performed as same as the usual DBG process using the grinder or so. By grinding from the back face, the wafer 1 becomes thinner, and the back face of the wafer reaches to the grooves 6, thereby the wafer 1 is divided into each individual chip 10.

(S3) Step

In (S3) step, each individual chip 10 is picked up together with the adhesive film 3 (not illustrated). The pick up of the chip having the adhesive film may be performed directly from the surface protective sheet 7. Alternatively, it may be performed after transferring the chip having the adhesive layer from the surface protective sheet 7 to other adhesive sheets, and pick up the chip having the adhesive film from said other adhesive sheet. As such other adhesive sheet, the adhesive sheet having appropriate pressure-sensitive adhesive property and removable property is used, and particularly, the ultraviolet curable adhesive sheet, which is conventionally used as the dicing sheet, is preferably used.

Note that, as described in above, in case the step of making the space between each chip 10 by expanding the surface protective sheet is included before the (S3) step, the adhesive film 3 may be cut by the stretching force during the expansion as shown in FIGS. 10 and 11. The surface protective sheet 7 has roughly the same shape as the wafer; hence it cannot be set to the expanding device. Thus, the pressure-sensitive adhesive sheet having a high stretch property is laminated to the back face of the surface protective sheet 7 and is set to the expanding device via said adhesive sheet to expand the adhesive sheet. Thereby, the surface protective sheet 7 is expanded. Also, in case each individual chip 10 and the adhesive film 3 are transferred to other adhesive sheet, the adhesive film 3 can be cut by expanding the other adhesive sheet.

The adhesive film 3 and the surface protective sheet 7 are stacked so that it can be removed. Therefore, if the chip 10 is picked up, the adhesive film 3 and the surface protective sheet 7 is peeled off at the boundary therebetween. Hence, the chip 10 is picked up, while the adhesive film 3 which is cut into the same shape as the chip 10 is adhered to the circuit face side of the chip 10. Also, it is easy to transfer the chip with the adhesive film to other adhesive sheet.

Also, in case the supporting film 4 is left on the adhesive film 3, the adhesive film 3 and the supporting film 4 are stacked removably. Therefore, when the chip 10 is picked up, the peeling occurs at the boundary between the adhesive film 3 and the supporting film 4. Hence, the chip 10 is picked up while the adhesive film 3, which is cut into the same shape as the chip 10, is adhered to the circuit face side of the chip 10. On the other hand, the supporting film 4 is left to the surface protective sheet 7.

The chip 10 can be picked up by known means such as suction collet or so. Also, the chip may be lifted from the back side of the surface protective sheet 7 or other adhesive sheet using thrust pins, depending on the needs.

The chip which has been picked up may proceed directly to the next step or after the flipping step of the chip. Alternatively, it may be kept on the transferring tape or in the storage container and proceed to the next step, depending on the needs.

(S4) Step

In (S4) step, individual chip 10 is placed on the predetermined position of electrode portions 12 or so of the chip mounting substrate 11 via the adhesive film 3 (refer to FIG. 12).

Specifically, the chip 10 having the adhesive film 3 on the circuit face side is placed on the predetermined chip mounting substrate 11 by facedown method. In case of the chip having the bumps 2, the bumps 2 thereof are placed so that it faces to the corresponding terminal parts 12 on the chip mounting substrate.

(S5) Step

In (S5) step, the die-bonded chip 10 having adhesive film is heated and the chip is fixed to the chip mounting substrate 11 (not illustrated).

The adhesive film 3 is formed by; the B-stage resin, the hardenable pressure sensitive adhesive or the thermoplastic resins or so which exhibits the adhesiveness due by heat as described in above. By heating these under the predetermined conditions, in case of B-stage resin, it will exhibit the adhesiveness due to the curing of the resin; and in case of the hardenable pressure sensitive adhesives, it will exhibit the adhesiveness due to the curing of the thermo-setting resins included therein. Also, in case of the thermoplastic resins, it will exhibit the adhesiveness due to the heat sealing.

(IP) Step

The manufacturing method of the semiconductor device of the present invention includes one or more times of the pressure applying step by applying the static pressure larger than a ambient pressure by 0.05 MPa or more to the stacked body including adhesive film 3, at any point after above described (S1) step and before (S5) step.

In the above described (S1) step, the air bubbles may be trapped in the space between the wafer circuit face and the adhesive film when adhering the adhesive film 3 to the circuit face of the wafer 1. Also, during (S4) step, the air bubbles may be trapped in the space between the chip mounting substrate surface 11 and the adhesive film 3. Particularly, recently, in many cases the indents due to the wiring pattern are formed on the surface of the chip mounting substrate 11, thus the voids are easily produced. During (S5) step, although it depends on the type of the adhesive film 3, the gas is produced from the adhesive film 3 when curing the adhesive film 3, thus the voids may be produced.

The present invention removes these voids or prevents the production thereof by applying the static pressure to the stacked body including the adhesive film 3.

The step of applying the static pressure is a step to apply the pressure evenly from every directions (static pressure) of the stacked body including the adhesive film 3 before the adhesive film 3 completely cures. The condition for applying the static pressure is; larger than 0.05 MPa with respect to the ambient pressure, and preferably +0.1 to +1.0 MPa with respect to the ambient pressure. That is a pressure larger than by 0.05 MPa or more, preferably by 0.1 to 1.0 MPa the ambient pressure is applied. The time for applying the pressure is 1 to 180 minutes, and more preferably 5 to 120 minutes. The temperature at that time is usually 30 to 140° C. or so. The pressure and the temperature may be applied gradually. Also, the static pressure may be applied under air atmosphere, or under the inactive gas atmosphere of Nitrogen or argon or so.

The condition for applying the static pressure varies depending on the compositions of the adhesive film 3; however it is applied under the condition such that the resin component constituting the adhesive film can flow due to the pressure. For example, incase the adhesive film 3 is the B-stage resin, the pressure is applied at the temperature in which the semi-cured resin can re-flow and at the temperature lower than the curing temperature of the resin. Also, in case the adhesive film 3 is the hardenable pressure sensitive adhesive, the static pressure is applied at the temperature lower than the temperature in which the thermosetting resin included in the adhesive layer completely cures and at the temperature in which the binder resin can flow. Also, in case the adhesive film 3 is the thermoplastic resin, the static pressure is applied at the temperature in which the thermoplastic resin can melt and flow.

When single direction compression is applied under the above described temperature condition, the resin component constituting the adhesive film 3 leaks out from the edge face of the wafer or the chip; and roll up towards the back face of the wafer or the chip. However, by applying the static pressure, the pressure is applied evenly to the whole body, hence the role up of the adhesive does not occur. Also, due to such application of the static pressure, the voids produced in the adhesive film are removed. Thus, according to the manufacturing method of the present invention including the step of applying the static pressure, highly reliable semiconductor device without the voids in the underfill material can be obtained.

Said step of applying the static pressure is performed at any point from the above described (S1) step to (S5) step; and it may be performed multiple times. Specifically, by applying the static pressure (IP) after the (S1) step, the air bubbles produced upon adhering the adhesive film 3 for the underfill to the wafer circuit face are removed. Also, by applying the static pressure (IP) after (S4) step, the air bubbles, which was taken in between the chip mounting substrate 11 surface and the adhesive film 3 upon die-bonding the chip 10 on the chip mounting substrate 10 via the adhesive film 3, can be removed.

Alternatively, the static pressure application (IP) may be performed simultaneously with (S5) step. (S5) step is a step of fixing the chip 10 to the chip mounting substrate 11 via the adhesive film 3 by heating the chip. By applying the static pressure simultaneously with the heating, the static pressure is applied at the heating step while the adhesive film 3 is somewhat flowable; hence the air bubbles produced at (S1) step or (S4) steps are removed. Also the production of the voids due to the gas production upon curing the adhesive film can be also suppressed. Furthermore, the static pressure is applied while heating, hence the chip 10 can be firmly adhered to the chip mounting substrate 11.

As the device for applying the static pressure, it is not particularly limited as far as the static pressure can be applied to the stacked body including the adhesive film 3 during (S1) to (S5) steps; however preferably autoclave (pressure resistant container with the compressor) or so are used.

After die-bonding (flip chip bonding) as such, the semiconductor device can be obtained via the ordinary step such as the resin sealing or so.

According to the manufacturing method of the present invention, an appropriate amount of underfill resin layer can be easily provided to the circuit surface of the chip by using the so-called DBG process. Thus, the DBG process can be combined with the mounting technique which mounts the circuit face side to the chip mounting substrate thereby the continuous process becomes possible. Also, even if the voids are produced in the underfill material during the mounting step, the voids are removed by applying the static pressure; thereby highly reliable semiconductor device can be obtained. Thus, according to the present invention, it is possible to continuously perform the mounting process which uses the so-called DBG process and flip chip bonding; and the manufacturing method of the semiconductor device contributing to simplify the manufacturing process and to improve the product quality can be provided.

Hereinabove, the manufacturing method of the present invention has been explained according to the drawings. However, the present invention is not to be limited to the above described embodiments and can be applied to the manufacturing method of semiconductor device having various constitutions.

For example, the manufacturing method of the present invention may be applied to the manufacturing method of semiconductor device of multi-stack type. That is, the method of the present invention can be applied to the die-bonding step wherein the chip relatively constituting the upper portion and the chip relatively constituting the lower portion are stacked via the adhesive film 3. In this case, the back side of the chip relatively constituting the lower portion (the opposite face of the circuit formed face) corresponds to the chip mounting substrate 11 in the above. The semiconductor device obtained in here can be a same size stack type semiconductor device wherein the upper portion and the lower portion have the same size. Alternatively, it may be a multi stack type semiconductor device having a different size in a step form.

EXAMPLE

The following will further explain the present invention in detail according to the examples, however the present invention is not to be limited to the examples.

The adhesive film and the wafer having the stud bumps which were used were manufactured as follows.
(The Manufacturing of the Adhesive Film)

For manufacturing the adhesive film, the following acrylic copolymer (A), thermosetting resin (B), heat-activatable latent curing agent (C), energy ray-polymerizable compound (D), photopolymerizable initiator (E), and crosslinking agent (F) were used.

(A) Acrylic Copolymer: A solution prepared by dissolving a copolymer having a weight average molecular weight of 300000, prepared by copolymerizing 55 parts by weight of butyl acrylate, 10 parts by weight of methyl methacrylate, 20 parts by weight of glycidyl methacrylate and 15 parts by weight of 2-hydroxyethyl acrylate, in an organic solvent (toluene/ethyl acetate=6/4) (solid content 50%)

(B) A Thermosetting Resin (Epoxy resin): A mixture composed of 22 parts by weight of bisphenol A type epoxy resin (Epikote 828, epoxy equivalent 180 to 220 eq/g, manufactured by Japan Epoxy Resins Co., Ltd.), a solution (solid content 60%) prepared by dissolving a solid bisphenol A type epoxy resin (Epikote 1055, epoxy equivalent 800 to 900 eq/g, manufactured by Japan Epoxy Resins Co., Ltd.) in an organic solvent (methyl ethyl ketone) in an amount corresponding to 44 parts by weight in terms of solid content, and a solution (solid content 70%) prepared by dissolving an o-cresol novolak type epoxy resin (EOCN-104S, epoxy equivalent 210 230 g/eq, manufactured by Nippon Kayaku Co., Ltd.) in an organic solvent (methyl ethyl ketone) in an amount corresponding to 14 parts by weight in terms of solid content.

(C) Heat-Activatable Latent Curing Agent: A solution (solid content 30%) prepared by dissolving a mixture of 1 parts by weight of dicyandiamide (Hardener 3636AS, manufactured by Asahi Denka Kogyo Ltd.) with 1 part by weight of 2-phenyl-4,5-hydroxymethylimidazole (CURESOL 2PHZ, manufactured by SHIKOKU CHEMICALS CORPORATION) in an organic solvent (methyl ethyl ketone).

(D) Energy Ray-Curable Resin: Dipentaerythritol hexaacrylate.

(E) Bezophenone type Photopolymerization Initiator: A solution (solid content 30%) prepared by dissolving IRGACURE 184 (manufactured by Ciba Specialty Chemicals, K.K.) in an organic solvent (toluene).

(F) Isocyanate Crosslinking Agent: A solution (solid content 38%) prepared by dissolving Coronate L (manufactured by Nippon Polyurethane Industry Co., Ltd.) in an organic solvent (toluene).

20 parts by weight of (A), 80 parts by weight of (B), 2 parts by weight of (C), 10 parts by weight of (D), 0.3 parts by weight of (E), and 0.3 parts by weight of (F) of above components were mixed together in terms of solid weight ratio, and methyl ethyl ketone was mixed therein so as to have a solid content of 55% to prepare a hardenable pressure sensitive adhesive composition. The hardenable pressure sensitive adhesive composition was coated onto the release treated face of a release film (SP-PET 3811, thickness 38 μm, manufactured by Lintec Corporation) so as to have a coating thickness of 50 μm on a dry basis, and the coating was dried at 100° C. for one minute. Next, the assembly was laminated onto a low-density polyethylene film (thickness 110 μm) which is to be supporting films to obtain an adhesive film.
(Manufacturing Wafer Having Stud Bumps)

Gold ball solders, were formed at the predetermined positions on a silicon wafer (8 inches, thickness 725 μm) using a bump bonder (SBB4, manufactured by SHINKAWA LTD.), were melted and extended, and were cut. Thus, a wafer having 45 μm-high stud bumps formed thereon was provided.

Example 1

The adhesive film having the supporting film in which the release film has been removed were laminated to the bump face of the wafer by a rubber laminate roller (rubber hardness 50) with a laminator (RAD 3510 m/12, manufactured by Lintec Corporation) under the conditions of laminating speed 3 mm/sec and load 3 MPa. Note that, the temperatures of the laminate roller and the table were 25° C.

The voids produced in the adhesive film while laminating the adhesive film to the wafer were removed ((IP) step), by introducing the wafer laminated with the adhesive film (the stacked body including the adhesive film) into the heat compression device (autoclave under air atmosphere, manufactured by KURIHARA Manufactory Inc.), then heating for 30 minutes at 50° C. under the static pressure of larger by 0.5 MPa with respect to the ambient pressure. The removal of the voids were visually confirmed and evaluated before and after the static pressure application step. The removal of the voids was confirmed by applying the static pressure with respect to before the static pressure application.

Next, ultraviolet irradiation (quantity of light 110 mJ/cm$^2$, illuminance 150 mW/cm$^2$) was carried out by using an ultraviolet light irradiation device (RAD 2000 m/8, manufactured by Lintec Corporation) to cure the energy ray curable resin of the adhesive layer. Then, the supporting film was removed.

The grooves along the circuit of the wafer were formed on the stacked body of the adhesive film and the wafer by cutting from the adhesive film side using the dicer (DFD-6361, manufactured by DISCO Inc.) so that the depth of grooves is 130 μm from the circuit face of the wafer ((FC) step). Next, the surface protective sheet (Adwill P-6130, manufactured by Lintec Corporation) comprising the removable adhesive layer was laminated on the adhesive film side of the wafer by using the tape laminator (Adwill RA D-3510 m/12, manufactured by Lintec Corporation). (Hereinabove (S1) step)

Then, the opposite side of the circuit face was ground by using the grinder (DGP-8760, manufactured by DISCO Inc.) so that the finished thickness is 100 μm; thereby the wafer was divided together with the adhesive film ((S2) step).

Next, the ultraviolet curable adhesive sheet (Adwill D-175, manufactured by Lintec Corporation) was laminated on the ground face side of the chip group, and then by removing the surface protective sheet, the chip group having the adhesive film was transferred to the ultraviolet curable adhesive sheet. After that, the chip having the adhesive film, which has been divided, was picked up from the ultraviolet curable adhesive sheet ((S3) step).

Next, the chip was mounted via adhesive film on a chip mounting substrate for evaluation having a wiring pattern corresponding to bump positions using a flip chip bonder (FB30T-M, manufactured by Kyushu Matsushita Electric Co., Ltd.) ((S4) step). For the flip chip bonder, the stage temperature was 60° C., the head temperature was 130° C., the load was 20N, and the time was 60 seconds.

After die-bonding, the assembly was held in an oven of 150° C. for 60 minutes to fully harden the adhesive film so that the chip was mounted on the chip mounting substrate to obtain the semiconductor device ((S5) step). The resistance value across the terminals of the semiconductor device thus obtained was measured by a low resistivity meter (Loresta-GP MCP-T600, manufactured by Mitsubishi Chemical Corporation) to confirm the electrical continuity between terminals to be conducted and insulation between other terminals. The conductivity and the insulation were good.

Example 2

As similar to the example 1, the adhesive film was laminated to the bump face of the wafer, then without performing the static pressure step, the energy-ray curable resin of the adhesive film was cured.

After removing the supporting film, the grooves along the circuit of the wafer were formed on the stacked body of the adhesive film and the wafer, by cutting from the adhesive film side using the dicer so that the depth of the grooves is 130 μm from the circuit face of the wafer ((FC) step). Next, the surface protective sheet was laminated on the adhesive film side of the wafer. (Hereinabove (S1) step) Then, the opposite side of the circuit face was ground by using the grinder so that the finished thickness is 100 μm; thereby the wafer was divided together with the adhesive film ((S2) step).

Next, as similar to Example 1, the group of chips having the adhesive film was transferred to the ultraviolet curable adhesive sheet. After that, the chip having the adhesive film, which has been divided, was picked up from the ultraviolet curable adhesive sheet ((S3) step).

Then, the chip was mounted via the adhesive film on a chip mounting substrate for evaluation having a wiring pattern corresponding to bump positions using a flip chip bonder. For the flip chip bonder, the stage temperature was 60° C., the head temperature was 130° C., the load was 20N, and the time was 60 seconds.

The die-bonded chip mounting substrate (the stacked body including the adhesive film) was introduced into the heat compression device, and heated under the static pressure of larger by 0.5 MPa with respect to the ambient pressure, at 50° C., for 30 minutes. Thereby the voids produced in the adhesive film while laminating the adhesive film to the wafer and die-bonding were removed ((IP) step). The removal of the voids was confirmed by applying the static pressure compared to before applying the static pressure.

Then the chip mounting substrate was held in an oven of 150° C. for 60 minutes to fully harden the adhesive film, and the chip was fixed to the chip mounting substrate. Thereby, the semiconductor device was obtained ((S5) step). The conductivity and the insulation of the obtained semiconductor device were good.

Example 3

As similar to Example 2, the chip having the adhesive film was obtained, similarly picked up, and die-bonded to the chip via the adhesive film ((S1) to (S4) and (FC) steps).

The die-bonded chip mounting substrate (the stacked body including the adhesive film) was introduced into the heat compression device (autoclave manufactured by KURIHARA Manufactory Inc.), and heated under static pressure of larger by 0.5 MPa with respect to the ambient pressure at 120° C. for 60 minutes and followed by heating at 140° C. for 60 minutes in a stepwise fashion to remove the voids and to cure the adhesive film ((IP) and (S5) steps). The removal of the voids was confirmed by applying the static pressure compared to before applying the static pressure. Also, the conductivity and the insulation of the obtained semiconductor device were good.

Example 4

As similar to Example 2, the wafer was divided together with the adhesive film ((S1), (S2), and (FC) steps).

The wafer divided together with the surface protective sheet (the multilayer body including the adhesive film) was introduced into the heat compression device and heated under the static pressure of larger by 0.5 MPa with respect to ambient pressure at 50° C. for 30 minutes to remove the voids which were produced in the adhesive film while laminating the adhesive film to the wafer ((IP) step). The removal of the voids was confirmed by applying the static pressure compared to before applying the static pressure.

Then, as similar to Example 1, the chip group having the adhesive film was transferred to the ultraviolet curable adhesive sheet. After that, the chip with the adhesive film was picked up from the ultraviolet curable adhesive sheet ((S3) step). As similar to Example 2, the chip was die-bonded via the adhesive film ((S4) step).

Next, the chip mounting substrate was held in the oven at 150° C. for 60 minutes to fully harden the adhesive film, and the chip was fixed to the chip mounting substrate; thereby, the semiconductor device was obtained ((S5) step). The conductivity and the insulation of the obtained semiconductor device were good.

Example 5

In Example 4, after the die-bonding, the chip mounting substrate being die-bonded (the stacked body including the adhesive film) was introduced into the heat compression device and was heated under the static pressure of larger by 0.5 MPa with respect to the ambient pressure at 50° C. for 30 minutes to remove the voids ((IP) step). The removal of the voids was confirmed by applying the static pressure compared to before applying the static pressure. Also, further voids were removed when the static pressure application step was performed twice, that is at before and after the die-bonding, as in the present example, as compared with the examples (Examples 2 and 4) in which the static pressure is applied only once.

Then the chip mounting substrate was held in an oven of 150° C. for 60 minutes to fully harden the adhesive film, and the chip was fixed to the chip mounting substrate. Thereby, the semiconductor device was obtained ((S5) step). The conductivity and the insulation of the obtained semiconductor device were good.

Example 6

By using the dicer, the wafer was cut from the circuit face to form the groove having the depth of 130 μm, and the groove along the circuit of the wafer was formed.

Next, by using the laminating device, the adhesive film which the release film has been removed was laminated to the bump face of the wafer with a rubber laminate roller at the laminating speed of 3 mm/second, and under the load of 3 MPa. Note that, the temperatures of the laminate roller and the table were 25° C. Next, ultraviolet irradiation (quantity of light 110 mJ/cm$^2$, illuminance 150 mW/cm$^2$) was carried out by using the ultraviolet light irradiation device to cure the energy ray curable resin of the adhesive layer.

The wafer wherein the adhesive film has been laminated (the stacked body including the adhesive film) was introduced into the heat compression device, and heated under the static pressure of larger by 0.5 MPa with respect to the ambient pressure, at 50° C., for 30 minutes. Thereby the voids produced in the adhesive film while laminating the adhesive film to the wafer was removed ((IP) step). The removal of the voids was confirmed by applying the static pressure compared to before applying the static pressure.

Then, the laser beam was applied to the adhesive film after removing the supporting film to cut through by burning the portion corresponding to the grooves of said wafer surface, thereby the adhesive film was completely cut ((FC) step).

Next, as similar to Example 1, the surface protective sheet was laminated ((S1) step) and the back face grinding of the wafer was performed, followed by dividing the wafer ((S2) step). Then pick-up of the chip, die-bonding and the curing of the adhesive film were performed ((S3) to (S5) steps). Both the conductivity and the insulation were good.

Example 7

As similar to Example 6, the adhesive film was laminated to the bump surface of the wafer wherein the grooves are formed. Then, the laser beam was applied to the adhesive film to cut through by burning the portion corresponding to the grooves; thereby the adhesive film was completely cut.

The wafer wherein the adhesive film has been laminated (the stacked body including the adhesive film) was introduced into the heat compression device, and heated under the static pressure of larger by 0.5 MPa with respect to the ambient pressure, at 50° C., for 30 minutes. Thereby the voids produced in the adhesive film while laminating the adhesive film to the wafer was removed ((IP) step). The removal of the voids was confirmed by applying the static pressure compared to before applying the static pressure.

Then, as similar to Example 1, the surface protective sheet was laminated ((S1) step) and the back face grinding of the wafer was performed, followed by dividing the wafer ((S2) step). Then pick-up of the chip, die-bonding and the curing of the adhesive film were performed ((S3) to (S5) steps). Both the conductivity and the insulation were good.

Example 8

As similar to Example 6, the adhesive film was laminated to the bump face of the wafer in which the grooves were formed. Then, the laser beam was applied to the adhesive film after removing the supporting film to cut through by burning the portion corresponding to the grooves of said wafer surface; thereby the adhesive film was completely cut ((FC) step).

Next, the surface protective sheet was laminated to the adhesive film side ((S1) step), then the back face grinding of the wafer was performed, and the wafer was divided ((S2) step).

The wafer (the multilayer body including the adhesive film) which has been divided was introduced into the heat compression device together with the surface protective sheet under the static pressure of larger by 0.5 MPa at 50° C. for 30 minutes to remove the voids ((IP) step). The removal of the voids was confirmed by applying the static pressure compared to before applying the static pressure.

Next, as similar to Example 1, the group of chips having the adhesive film was transferred to the ultraviolet curable adhesive sheet. After that, the chips having the adhesive film, which has been divided, were picked up from the ultraviolet curable adhesive sheet ((S3) step), and was die-bonded as similar to Example 1 ((S4) step).

Then the chip mounting substrate was held in an oven of 150° C. for 60 minutes to fully harden the adhesive film, and the chips were fixed to the chip mounting substrate. Thereby, the semiconductor device was obtained ((S5) step). The conductivity and the insulation of the obtained semiconductor device were good.

Example 9

As similar to Example 6, the adhesive film was laminated to the bump face of the wafer in which the grooves are formed, and the static pressure was applied to the stacked body including the adhesive film ((IP) step). The removal of the voids was confirmed by applying the static pressure compared to before applying the static pressure.

Then, as similar to Example 6, the cutting of the adhesive film ((FC) step), the lamination of the surface protective sheet ((S1) step), the back face grinding of the wafer ((S2) step), the pick-up of the chips ((S3) step), and the die-bonding ((S4) step) were performed.

Next, the chip mounting substrate was held in the oven at 150° C. for 60 minutes to fully harden the adhesive film, and the chip was fixed to the chip mounting substrate; thereby, the semiconductor device was obtained ((S5) step). The conductivity and the insulation of the obtained semiconductor device were good.

Example 10

As similar to Example 6, the adhesive film was laminated to the bump face of the wafer in which the grooves are formed.

Then, as similar to Example 8, the cutting of the adhesive film ((FC) step), the lamination of the surface protective sheet ((S1) step), the back face grinding of the wafer ((S2) step), and the application of the static pressure to the stacked body including the adhesive film were performed ((IP) step). The removal of the void was confirmed by applying the static pressure compared to before applying the static pressure.

Next, as similar to Example 1, the group of chips having the adhesive film was transferred to the ultraviolet curable adhesive sheet. After that, the chips having the adhesive film, which has been divided, were picked up from the ultraviolet curable adhesive sheet ((S3) step), and was die-bonded as similar to Example 1 ((S4) step).

Then the chip mounting substrate was held in an oven of 150° C. for 60 minutes to fully harden the adhesive film, and the chip was fixed to the chip mounting substrate. Thereby, the semiconductor device was obtained ((S5) step). The conductivity and the insulation of the obtained semiconductor device were good.

Example 11

As similar to Example 6, the adhesive film was laminated to the bump face of the wafer in which the grooves are formed.

Then, as similar to Example 6, the cutting of the adhesive film ((FC) step), the lamination of the surface protective sheet ((S1) step), the back face grinding of the wafer ((S2) step), the pick-up of the chips ((S3) step), and the die-bonding ((S4) step) were performed.

The chip mounting substrate (the stacked body including the adhesive film) being die-bonded after the die-bonding was introduced into the heat compression device and heated under the static pressure larger by 0.5 MPa with respect to the ambient pressure at 50° C. for 30 minutes to remove the voids ((IP) step). The removal of the void was confirmed by applying the static pressure compared to before applying the static pressure.

Then the chip mounting substrate was held in an oven of 150° C. for 60 minutes to fully harden the adhesive film, and the chip was fixed to the chip mounting substrate. Thereby, the semiconductor device was obtained ((S5) step). The conductivity and the insulation of the obtained semiconductor device were good.

Example 12

As similar to Example 6, the adhesive film was laminated to the bump face of the wafer in which the grooves are formed, and the static pressure was applied to the stacked body including the adhesive film ((IP) step). The removal of the voids was confirmed by applying the static pressure compared to before applying the static pressure.

Then, as similar to Example 6, the lamination of the surface protective sheet ((S1) step) and the back face grinding of the wafer ((S2) step) were performed.

Next, the expandable adhesive sheet was laminated to the back face of the surface protective sheet and expanded after setting to the expanding jig, then simultaneously with expanding the spaces between the chips, the adhesive films existing between the chips were cut ((FC) step). Then, the pick-up of the chips ((S3) step) and the die-bonding ((S4) step) were performed.

Then the chip mounting substrate was held in an oven of 150° C. for 60 minutes to fully harden the adhesive film, and the chips were fixed to the chip mounting substrate. Thereby, the semiconductor device was obtained ((S5) step). The conductivity and the insulation of the obtained semiconductor device were good.

Example 13

As similar to Example 6, the adhesive film was laminated to the bump face of the wafer in which the grooves are formed.

Then, as similar to Example 8, the cutting of the adhesive film ((FC) step), the lamination of the surface protective sheet ((S1) step), the back face grinding of the wafer ((S2) step), and the application of the static pressure to the stacked body including the adhesive film were performed ((IP) step). The removal of the voids was confirmed by applying the static pressure compared to before applying the static pressure.

Next, the expandable adhesive sheet was laminated to the back face of the surface protective sheet and expanded after setting to the expanding jig, then simultaneously with expanding the spaces between the chips, the adhesive films existing between the chips were cut ((FC) step). Then, the pick-up of the chips ((S3) step) and the die-bonding ((S4) step) were performed.

Then the chip mounting substrate was held in an oven of 150° C. for 60 minutes to fully harden the adhesive film, and the chips were fixed to the chip mounting substrate. Thereby, the semiconductor device was obtained ((S5) step). The conductivity and the insulation of the obtained semiconductor device were good.

Example 14

As similar to Example 6, the adhesive film was laminated to the bump face of the wafer in which the grooves are formed.

Then, as similar to Example 8, the lamination of the surface protective sheet ((S1) step) and the back face grinding of the wafer ((S2) step) were performed. Next, the expandable adhesive sheet was laminated to the back face of the surface protective sheet and expanded after setting to the expanding jig, then simultaneously with expanding the spaces between the chips, the adhesive films existing between the chips were cut ((FC) step). Then, the pick-up of the chips ((S3) step) and the die-bonding ((S4) step) were performed.

The chip mounting substrate (the multilayer body including the adhesive film) being die-bonded after the die-bonding was introduced into the heat compression device and heated under the static pressure larger by 0.5 MPa with respect to the ambient pressure at 50° C. for 30 minutes to remove the void ((IP) step). The removal of the void was confirmed by applying the static pressure compared to before applying the static pressure.

Then the chip mounting substrate was held in an oven of 150° C. for 60 minutes to fully harden the adhesive film, and the chip was fixed to the chip mounting substrate. Thereby, the semiconductor device was obtained ((S5) step). The conductivity and the insulation of the obtained semiconductor device were good.

Comparative Example 1

Except for not performing the step of applying the static pressure to the stacked body including the adhesive film, a mimetic semiconductor device was obtained as similar to Example 1. Since the static pressure was not applied, the removal of the voids was not confirmed, and also the conductivity and the insulation of the semiconductor device were not good.

The invention claimed is:

1. A manufacturing method of a semiconductor device comprising:

laminating a surface protective sheet to a circuit surface side of a wafer formed with grooves which divide each circuit wherein an adhesive film is adhered on the circuit surface of the wafer;

reducing the thickness of the wafer and finally dividing the wafer into individual chips by grinding a back face of the wafer;

picking up individual chips together with the adhesive film;

die-bonding said individual chip to predetermined position of a chip mounting substrate via said adhesive film;

fixing the chip to the chip mounting substrate by heating the die-bonded chip having the adhesive film; and applying a static pressure larger than an ambient pressure by 0.05 MPa or more to a stacked body including the adhesive film one or more times, at any point between adhering the wafer to the adhesive film and fixing the chip to the chip mounting substrate.

2. The manufacturing method of a semiconductor device as set forth in claim 1 wherein the static pressure is applied after the die-bonding.

3. The manufacturing method of a semiconductor device as set forth in claim 1 wherein the chip is fixed to the chip mounting substrate while applying the static pressure.

* * * * *